United States Patent [19]
Cantrell et al.

[11] Patent Number: 5,418,825
[45] Date of Patent: May 23, 1995

[54] TIME-DOMAIN BOUNDARY BRIDGE METHOD AND APPARATUS

[75] Inventors: Jay T. Cantrell, Dallas; Edward R. Schurig, Plano, both of Tex.

[73] Assignee: Texas Instruments Incorporated, Dallas, Tex.

[21] Appl. No.: 218,879

[22] Filed: Mar. 28, 1994

Related U.S. Application Data

[63] Continuation of Ser. No. 945,771, Sep. 16, 1992, abandoned.

[51] Int. Cl.⁶ .......................................... H03K 21/00
[52] U.S. Cl. ................... 377/48; 365/189.12; 395/164; 327/113
[58] Field of Search ................ 377/48, 102; 365/189.12; 395/164, 550; 307/475, 269; 328/63, 72

[56] References Cited

U.S. PATENT DOCUMENTS

| | | | |
|---|---|---|---|
| 4,851,710 | 7/1989 | Grivna | 377/66 |
| 4,873,703 | 10/1989 | Crandall et al. | 395/550 |
| 5,099,141 | 3/1992 | Utsunomiya | 328/63 |
| 5,125,089 | 6/1992 | McCambridge | 395/550 |
| 5,146,584 | 9/1992 | Christensen | 395/550 |

*Primary Examiner*—Margaret Rose Wambach
*Attorney, Agent, or Firm*—Mark E. Courtney; Robby T. Holland; Richard L. Donaldson

[57] ABSTRACT

A method and apparatus for a time domain boundary bridge circuit for capturing an event on an asynchronous input is described, comprising an S-R latch coupled to an asynchronous input, a first D flip-flop coupled to a synchronous clock and the output of the S-R latch, and a second D type flip-flop coupled to a synchronous clock and the output of the first D flip-flop, and having an output coupled to a circuit output terminal, operable to provide a synchronous output which reflects an event occurrence on the asynchronous input. A second embodiment is disclosed for use in systems where the asynchronous input signal is accompanied by a clock or strobe signal comprising a first D type flip-flop clocked on the strobe signal coupled to the asynchronous input signal, a second D type flip-flop clocked on a synchronous clock and coupled to the output of the first D type flip-flop, a third D type flip-flop coupled to the output of the second D type flip-flop and driving a circuit output terminal, and self clearing logic which clears the first D type flip-flop when the event is synchronously transmitted on the circuit output. A third embodiment is disclosed wherein the second embodiment additionally comprises rapid self-clearing logic improving the throughput rate possible on the asynchronous input signal. Other embodiments are also disclosed.

20 Claims, 2 Drawing Sheets

Acknowledge to domain A. Domain A controller must release "event" within clock period.

Domain A event captured in domain B.

TIME-DOMAIN BOUNDARY BRIDGE METHOD AND APPARATUS

This application is a Continuation of application Ser. No. 07/945,771, filed Sep. 16, 1992, now abandoned.

RELATED APPLICATIONS

This application relates to co-pending U.S. patent application No. 945,548, entitled "Time Domain Boundary Bridge Method and Apparatus for Asynchronous Sequential Machines", TI-17202, filed Sep. 16, 1992; and to copending U.S. patent application No. 07/945,547, entitled "Time Domain Boundary Buffer Method and Apparatus", TI-17201, filed Sep. 16, 1992.

FIELD OF THE INVENTION

This invention generally relates to a method and apparatus for providing an improved circuit for coupling synchronous circuitry to an asynchronous signal or event for use by the synchronous circuitry, wherein it is desirable that the detection of the asynchronous signal or event occur without restricting the asynchronous event or signal to have a specified duration and that the asynchronous signal or event not be restricted to transitioning beneath certain maximum rates. The method and apparatus disclosed is applicable to circuits, integrated circuits and systems wherein observation or detection of asynchronous events or signals is required.

BACKGROUND OF THE INVENTION

Without limiting the scope of the invention, its background is described in connection with a synchronous circuit coupled to an asynchronous bus interface.

In systems using an asynchronous bus to couple devices, the receiving device contains synchronous circuitry which must reliably detect and respond to signals and events present on the asynchronous bus. To accomplish this the asynchronous signal present at the bus interface must be synchronized to the time domain used within the receiving circuit.

Heretofore, in the design of logic coupled to asynchronous bus circuitry, the typical approach to these problems is to provide a two clock synchronizer which receives the incoming asynchronous signal into a pair of serially coupled registers clocked on the clock of the synchronous circuitry time domain, so that a metastable condition on the first register caused by a transition in the asynchronous signal or event is not transferred to the output of the second register, effectively isolating the asynchronous event from the synchronous time domain and preventing errors caused by metastability due to transitions at or near the clock edges. In order for the prior art approach to function it is required that the asynchronous event or signal being detected or observed have a pulse width greater than at least 1 of the synchronous clocks in duration; alternatively handshaking protocols can be used where the asynchronous event is required to remain present until the synchronous receiving circuit acknowledges that it has successfully captured the event. Both of these approaches undesirably restrict the asynchronous signals and result in slower throughput than is desirable on the asynchronous bus.

A need for an easily implemented method and apparatus for reliably synchronizing asynchronous signals or events without unduly restricting the duration of such signals or events on an asynchronous bus thus exists.

Accordingly, improvements which overcome any or all of these problems are presently desirable.

SUMMARY OF THE INVENTION

Generally, and in one form of the invention, a circuit is described which implements a time domain boundary circuit in any standard digital logic 15 process. A first embodiment is described wherein an event or signal is coupled to a time domain boundary bridge circuit comprising an S-R latch followed by two synchronization registers clocked on the synchronous circuitry clock, the S-R latch being self cleared when the event has been synchronized so that the time domain boundary bridge circuit is ready to receive subsequent asynchronous events. A second embodiment is described wherein the asynchronous signal is accompanied by a clock or strobe signal, the signal is coupled to an edge triggered register clocked on the clock or strobe signal, then again followed by two synchronization registers clocked on the synchronous clock, the circuit being cleared when the asynchronous event is captured in the synchronous clock domain. A third preferred embodiment is described wherein the second preferred embodiment contains circuitry to clear the time domain boundary circuitry faster so that subsequent events may be captured at a higher rate.

An IC is described for use in a multiple chip bus system, wherein application logic from a standard ASIC or standard cell library is coupled to a plurality of input buffers containing the time domain boundary circuitry. A system is described wherein each IC in the system contains the time domain boundary circuitry and the IC's are coupled together to communicate on a multiple device bus. The system thus created will exhibit superior throughput characteristics while providing highly accurate signal and event detection.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
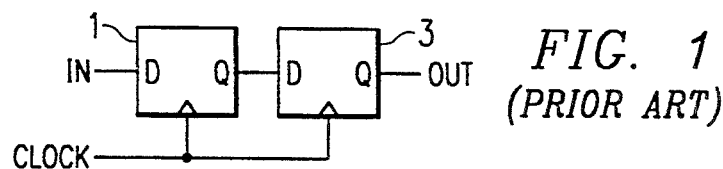
FIG. 1 depicts a typical prior art circuit for capturing asynchronous signals in a synchronous system.

FIG. 1 depicts a typical prior art circuit for capturing an asynchronous signal. Flip-flop 1 is coupled to the clock of the synchronous circuitry and to the event or signal being captured. Flip-flop 3 is coupled to the output of flip-flop 1, to the clock of the synchronous domain, and the output of the circuit. The second flip-flop 3 is coupled to the clock signal, the output of the first flip-flop 1 and the output of flip-flop 3 is coupled to the output of the synchronizer circuit.

In operation, the circuit captures the signal at the input terminal at one edge of the clock signal. The first register 1 then holds the result at its output which is reflected at the output terminal at the second clock cycle edge. Once the first register 1 captures the signal or event, the signal or event may transition back to its original state. The input signal must be greater than at least one clock pulse in duration to guarantee that it be captured by the synchronizer circuit. The clock period must be greater than the typical metastable condition time of the flip-flops to prevent metastable conditions, or "ringing", from appearing at the output of flip-flop 3. The use of two flip-flops is necessary in case the signal being captured transitions at or near the clock edge putting the first flip-flop into a metastable or "ringing" condition, so that logic circuitry coupled to the output of the synchronizer is isolated from any such condition.

Figure 2:
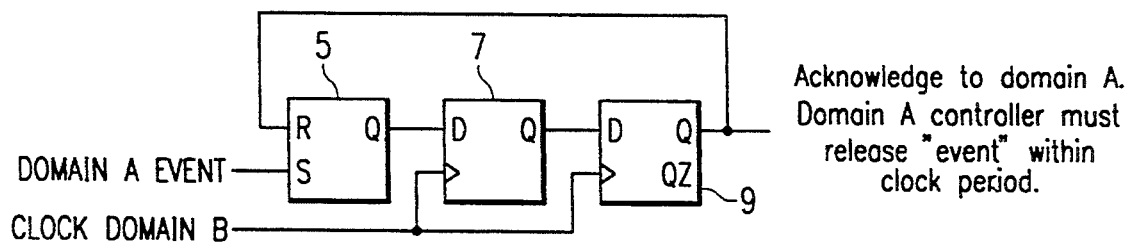
FIG. 2 depicts a first embodiment of the time domain boundary bridge circuit of the invention.

FIG. 2 depicts a first embodiment of the circuit of the invention. The signal or event to be detected is placed on the input labeled "Domain A event". The synchronous clock is placed on the input labeled "Clock Domain B". The "Domain A event" input is coupled to the S input of S-R latch 5, the output of which is coupled to the input of register 7, the first register in a two clock synchronizer. Register 9 is serially coupled to register 7 to complete the two clock synchronizer. The register 9 output is coupled to an output signal terminal labeled "acknowledge to Domain A" which may be used to acknowledge the successful capture of the event back to the Domain A controller which transmitted the asynchronous signal. The output of register 9 is also coupled to the reset input of S-R latch 5 in a feedback fashion.

In operation, the event being detected or observed is placed at the input labeled "Domain A event". Once an event is present, it will asynchronously set the S-R latch 5. On the following clock edge of the clock from Domain B, the output of latch 5 will be synchronized to Domain B by register 7. Because the event and the output of S-R latch 5 will transition asynchronously with respect to the Domain B Clock, the two clock synchronizer of the prior art is coupled to the S-R latch 5. In order that no events be missed by the circuit, it is desirable to send an acknowledge back to the Domain A controller driving the Domain A event input. This acknowledge will indicate that the circuit is ready to receive another event for synchronization. Also, the event present on the input labeled "Domain A event" must be released within the Domain B clock cycle after the acknowledge is received, otherwise the time domain boundary bridge will capture the same event from Domain A twice in Domain B.

Figure 3:
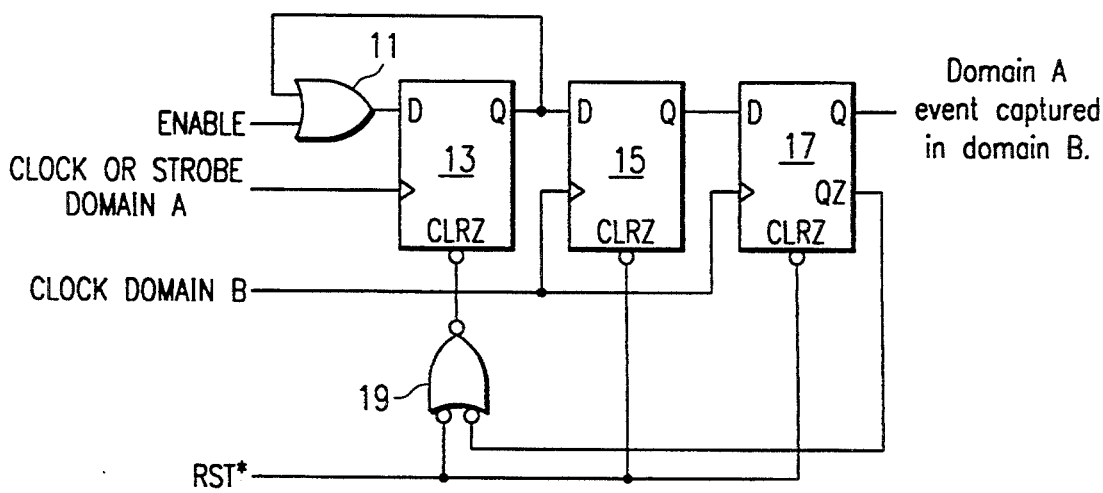
FIG. 3 depicts an alternative embodiment of the time domain boundary bridge circuitry of the invention wherein a strobe or clock is available from the asynchronous bus.

FIG. 3 depicts an alternative arrangement of the time domain boundary bridge circuit of the invention, for use in systems where the event being captured is accompanied by a clock or strobe signal. This embodiment is appropriate for applications wherein it is necessary to couple signals from one synchronous time domain, Domain A, to a second synchronous time domain, Domain B, where the two time domains are asynchronous with respect to each other. The signal being captured in FIG. 3 is placed on the "Enable" input signal. The "Enable" input signal is coupled to the D input of register 13 through the OR gate 11. A clock or strobe from the asynchronous domain, Domain A, is input to the clock input of register 13. The output of register 13 is then coupled to the first register, register 15, of a two clock synchronizer circuit clocked on the clock for Domain B, labeled "Clock Domain B". The output of register 15 is serially coupled to the input of register 17. The output of register 15 is then coupled to the signal output terminal, labeled "Domain A event captured in Domain B". In FIG. 3, a self clearing circuit is also provided. The QZ output of register 17 is used to forcibly clear the contents of register 13 through NOR gate 19. A reset signal RST* is also provided to initialize the circuit at power up.

In operation, when an event occurs in Domain A on the "Enable" input and is clocked into register 13 by the Domain A strobe or clock, the OR gate 11 is used to hold the value in register 13. This is done so that the event may end on the bus for subsequent Domain A cycles without register 13 being inadvertently cleared by the Domain A Clock or Strobe. After the event is captured by the Domain A clock, the output of the register 13 will set up the capture in Domain B by the edge of the Domain B clock at register 15. Again, the output of register 13 is clocked on the Domain A clock and therefore will transition asynchronously with respect to Clock B. In order to reliably capture the data and prevent metastable signals from reaching the Clock B domain logic the two clock synchronizer discussed above is again utilized. Register 15 is the first register in a two clock synchronizer, register 17 is serially coupled to register 15, and the Q output of register 17 is coupled to the output terminal of the time domain boundary circuit of the invention labeled "Domain A event captured in Domain B".

Once the event reaches register 17, the QZ output of register 17 will transition to a low state. This will cause NOR gate 19 to asynchronously clear register 13. Once this register is cleared, the next edge of Clock B will clock a zero through the two clock synchronizer. Thus each event captured by the register 13 clocked on the Clock A domain clock will result in a two clock wide pulse output from the time domain boundary bridge circuit at the output terminal. This analysis assumes that the Domain A enable signal will be released a the next Domain A clock unless a second event in Domain B is desired.

Figure 4:
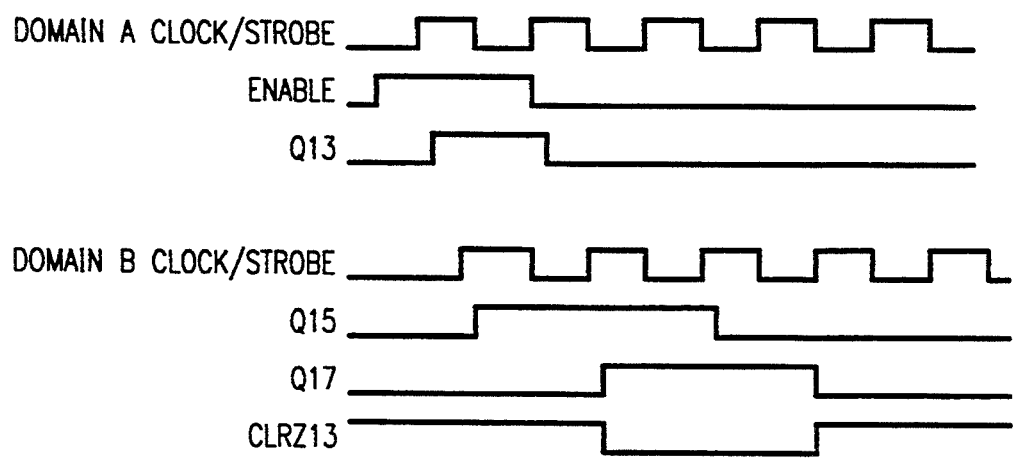
FIG. 4 depicts a timing diagram for the operation of the circuitry depicted in FIG. 3.

FIG. 4 illustrates the relative timing of the operation of the circuitry of FIG. 3. The domain A signals are at the top half of the diagram. The Domain A Clock/Strobe and the Domain B Clock/Strobe signals are unrelated and asynchronous. Also, the point in time where the Enable signal transitions is unrelated to Clock B and is arbitrary with respect to Clock B.

In the figure, an event from the domain A time domain occurs and is captured in the register 13, the output of which is represented in the diagram as Q13. The output of register 13 is coupled to the D input of register 15, which is clocked on the Domain B clock in the diagram; the output of register 15 will transition on the next rising edge of Clock B, as shown in the diagram by the signal labeled Q 15. The output of register 15 is coupled to the input of register 17. The output of register 17 will transition on the second rising edge of Clock B after the initial capture of the Domain A event in register 13, and this is represented by the signal labeled Q17. The output of register 17 will also drive the self clearing logic to register 13, through the operation of gate 19, this is represented in the diagram by the signal labeled CLRZ13. Once the CLRZ13 signal reaches a low state, register 13 is instantaneously cleared and is ready to receive another Domain A event on the Enable input. The output of register 17 is coupled to the circuit output terminal, and will be a pulse of two Domain B clocks in width, as shown in the diagram. Note that the CLRZ13 signal remains active throughout this period, preventing the capture of any additional Domain A events until the CLRZ13 line returns to a high state.

Figure 5:
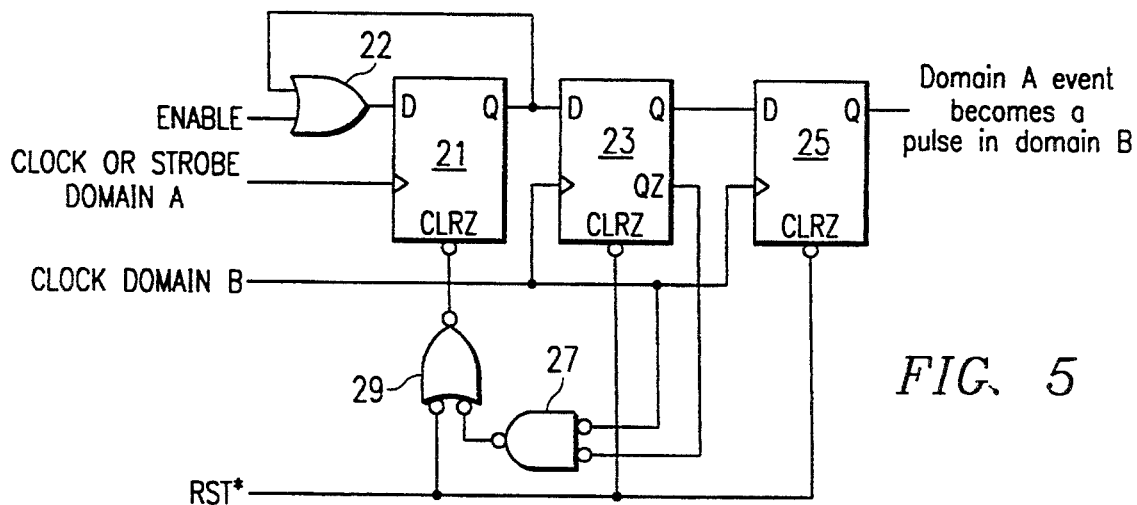
FIG. 5 depicts an alternative arrangement of the preferred embodiment of FIG. 3 wherein the self clearing circuitry will operate faster to provide for detection of rapidly transitioning signals and events.

FIG. 5 depicts a third preferred embodiment of the time domain boundary bridge of the invention, which is a variant of the arrangement depicted in FIG. 3 for use in systems where a fast self-clearing of the circuit is needed. Register 21 is again a D-type flip-flop register clocked on a Clock or Strobe signal from Domain A. The event or signal to be captured is coupled to the circuit input terminal labeled "Enable", and is coupled through OR gate 22 to the D input of register 21. Registers 23 and 25 again form the two clock synchronizer circuit as discussed above. NAND gate 27 and NOR gate 21 are used to form the improved self clearing circuitry needed for this application.

In operation, the signal or event presented at the "Enable" input terminal is captured into register 21 at one edge of the clock signal presented on the Clock Domain A input terminal. OR gate 22 is used to cause the register to hold the captured event until the self clearing logic clears it out of register 21. Registers 23 and 25 will synchronize the event to the clock of time domain B as before.

When the event is captured in register 23, the self clearing circuitry will be enabled by the low logic value at the input to the NAND gate 27. The register 23 is capturing an input which is asynchronous with respect to Clock Domain B, so a metastable condition may result. Register 23 is designed so that the metastable condition will end by the end of the high portion of the clock cycle. Nand gate 27 will gate the QZ output signal from register 23 with the clock signal Clock Domain B so that the self clearing circuitry is not active until the clock signal Clock Domain B falls low. When the clock signal on Clock Domain B is also low, the output of the NAND gate will transition which will result in a low logic value being sourced by NOR gate 29 onto the clear input to register 21. The self clearing logic circuitry in FIG. 4 thus results in a clear to register 21 a full clock cycle earlier than the clearing circuitry in FIG. 3. This arrangement will be preferred in environments where the event or signal being captured has a fast transition rate and each event is of short duration. The output at the circuit output terminal will thus be a pulse which is one clock wide in time domain B. It is critical that the registers clocked on Clock Domain B be designed such that the registers will not remain in a metastable state for more than one half of one clock cycle. If this is not possible for a particular choice of technology or the particular registers used, the embodiment depicted in FIG. 3 and described above is preferred.

Figure 6:
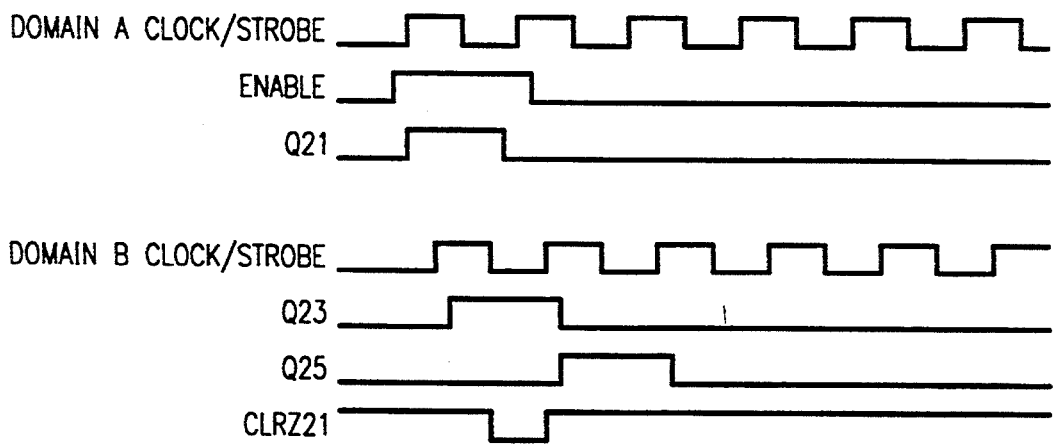
FIG. 6 depicts a timing diagram for the operation of the circuitry depicted in FIG. 5.

FIG. 6 is a timing diagram which illustrates the relative timings of the operation of the circuitry depicted in FIG. 4. The Enable signal at the top of the diagram represents an event occurring in time domain A. This is captured in register 21 on the next rising edge of the Domain A clock, and the output of this register is represented in the diagram by the signal labeled Q21. The output of register 21 is coupled to register 23 and is captured into register 23 on the next rising edge of the Domain B clock, represented in the diagram by the signal labeled Domain B clock/strobe. The output of register 23 is represented in the diagram by the signal labeled Q23. The output of register 23 is coupled to the register 25 and will be captured into the register 25 on the second rising clock edge of the time domain B clock, labeled Domain B Clock/Strobe. The output of register 25 is represented in the diagram by the signal labeled Q25. Note that the self clearing circuitry is coupled to the first register in the two clock synchronizer, register 23. This is different from the arrangement depicted in FIG. 2. The circuitry depicted in FIG. 4 therefore has much faster response. The signal CLRZ21 in the timing diagram of FIG. 5 depicts the action of the self clearing logic. Once the output of register 23 is at a logic high state, the falling edge of Clock B will cause a low output from gate 29, which will instantaneously clear the register 21, and ready it to receive additional events from the asynchronous bus. The result of this faster self clearing logic is that the output of the register 23, and thus the output of the circuit, is a pulse only one clock wide. Also, the self clearing signal CLRZ21 is only active for one half of one clock cycle, so additional events may be capture faster than would be the case with the arrangement of FIG. 2. The user is advised to be sure that the clock period of the clock of domain B is at least twice the time duration of the metastability delay of register 23. This is required to ensure the CLRZ21 output from gate 29 does not transition while the register 23 is still settling. Gate 29 acts as a holdoff to delay the CLRZ21 signal until the output of register 23 is stable. If one half of the clock period of the clock of domain B is less than the metastable delay of register 23, the CLRZ21 signal could transition erroneously causing a loss of data in register 21.

Figure 7:
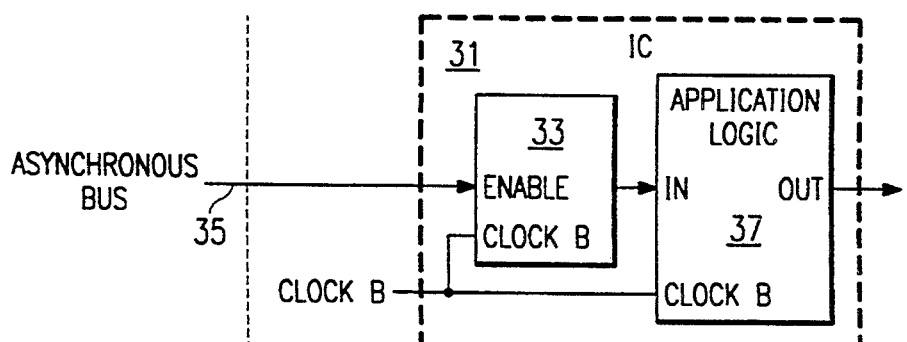
FIG. 7 depicts an IC incorporating the time domain boundary bridge circuit of the invention and further containing user specified application logic circuitry.

FIG. 7 depicts the use of one of the preferred embodiments of the time domain boundary bridge circuit of the invention in an integrated circuit 31 comprising at least one of the time domain boundary bridges 33 coupled to various event signals on an asynchronous communications bus 35, synchronous user specified logic 37 coupled to other inputs and outputs, and further coupled to the time domain boundary bridges so that the internal application specific logic may receive and observe events on the asynchronous bus and reliably operate on them. In operation the user specified application logic 37 may receive and observe events from the asynchronous bus 35 without omitting or missing asynchronous events and without erroneously responding to a metastable signal inside the IC caused by the asynchronous nature of the bus, due to the advantageous use of the invention. The application logic may be any type required for the users particular system, including ROM, RAM, EPROM, ALU's, microprocessors, digital signal processing logic, or any other analog or digital logic circuitry.

A few preferred embodiments have been described in detail hereinabove. It is to be understood that the scope of the invention also comprehends embodiments different from those described, yet within the scope of the claims. Words of inclusion are to be interpreted as nonexhaustive in considering the scope of the invention.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware. Process diagrams are also representative of flow diagrams for microcoded and software based embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. Circuitry for coupling synchronous logic circuitry to an asynchronous input signal, comprising:
   a first memory coupled to an input terminal, operable to selectively capture the data present at said input terminal responsive to a transition of said input signal;
   a second memory coupled to said first memory and clocked by a clock signal supplied by said synchronous logic circuitry;
   a third memory coupled to said second memory and clocked by said clock signal and having its output coupled to a circuit output terminal;
   self clearing logic comprising a NOR gate coupled between said output of said third memory and said first memory, operable to clear said first memory in response to the pulse at the output of said third memory, for enabling said first memory to capture subsequent transitions at the input terminal; and
   operable to produce a pulse at said output terminal which is two clock periods in duration, responsive to a transition by said input signal.

2. The circuitry of claim 1, wherein said first memory comprises an S-R latch circuit.

3. The circuitry of claim 1, wherein said second and third memories comprise D type flip-flops.

4. The circuitry of claim 1, wherein said NOR gate is further coupled to a reset input terminal, operable to clear the first memory responsive to a transition on said reset input terminal.

5. The circuitry of claim 4, wherein said third flip flop has an inverted output terminal, said inverted output terminal being coupled to said NOR gate.

6. Circuitry for coupling an output transmitted by synchronous logic clocked on a first clock regime to synchronous logic clocked on a second clock regime, comprising:
   a first memory coupled to an input terminal and clocked on a clock signal from said first clock regime, operable to capture a signal transmitted by said synchronous logic clocked on said first clock regime;
   a second memory coupled to said first memory and clocked on a clock signal from said second clock regime;
   a third memory coupled to said second memory and coupled to said clock signal from said second clock regime, having an output coupled to a circuit output terminal; and
   operable to provide a pulse at said circuit output terminal synchronized to said second clock signal in response to a transition at said circuit input being captured in said first memory by said first clock signal.

7. The circuitry of claim 6, wherein said first memory further comprises recirculation circuitry operable to cause the memory to hold said captured signal after said input signal transitions back to its original value.

8. The circuitry of claim 7, and further comprising:
   self clearing logic coupled between the output of said third memory and the first memory, operable to cause the first memory to be cleared responsive to the transition at the output of the third memory.

9. The circuitry of claim 7, wherein said first, second and third memories comprise D type flip-flops.

10. The circuitry of claim 8, wherein said self clearing logic comprises a NOR logic gate coupled between an inverting output of said third memory and an asynchronous clear input to said first memory, operable to clear said first memory when the inverting output of said third memory transitions from a high logic state to a low logic state in response to the capture of a transition at the input terminal.

11. Circuitry for coupling a signal transmitted by synchronous logic circuitry clocked on a first clock regime to receiving logic circuitry clocked on a second clock regime, comprising:
   a first memory coupled to an input terminal, operable to capture data present at the input terminal responsive to a clock edge of a clock signal from said first clock regime, and further operable to selectively hold said captured data until cleared by self clearing logic circuitry;
   a second memory coupled to said first memory and clocked on a clock signal supplied by said second clock regime, and further having an inverted output terminal coupled to said self clearing circuitry;
   a third memory coupled to said second memory and clocked on said clock signal supplied from said second clock regime, and having am output coupled to a circuit output terminal;
   operable to provide a pulse of one clock period in duration at the circuit output terminal synchronized to the clock signal supplied by said second clock regime in response to a transition at the input clocked into said first memory by the clock signal supplied by said first clock regime.

12. The circuitry of claim 11, wherein said self clearing logic circuitry comprises a logic NAND gate having a first input coupled to said inverting output terminal of said second memory and having a second input coupled to the clock signal supplied by said second clock regime, being coupled to the asynchronous clear input of said first memory, operable to clear said first memory on the transition from a high logic level to a low logic level of said clock signal when the inverting output of said second memory is at a low logic level.

13. A method of coupling synchronous logic circuitry to an asynchronous signal, comprising the steps of:
   providing a first memory coupled to an input terminal for receiving said asynchronous signal, and having a clear input operable to clear said first memory;
   providing a second memory docked on a synchronous clock signal, and coupled to said first memory;
   providing a third memory docked on said synchronous dock signal and coupled to said second memory and having an output coupled to a circuit output terminal;

providing self clearing logic comprising a NOR gate coupled between the output of said third memory and said clear input to said first memory; and operating said first, second and third memory to produce a pulse at the output responsive to a transition by said asynchronous input signal, said first memory being cleared by said self clearing logic when the pulse appears at said circuit output terminal, so that said first memory is enabled to capture subsequent transitions on said asynchronous input.

14. The method of claim 13, wherein said step of providing said first memory comprises providing an S-R latch circuits.

15. The method of claim 14, wherein said steps of providing a second and a third memory comprise providing D type flip flop circuits.

16. A method for coupling the output of synchronous logic circuitry clocked on a first clock regime to synchronous logic circuitry clocked on a second clock regime, comprising the steps of:

providing a first memory coupled to an input terminal and clocked on a clock signal synchronous to said first clock regime;

providing a second memory coupled to said first memory and clocked on a clock signal synchronous to said second clock regime;

providing a third memory coupled to said second memory and clocked on said clock signal synchronous to said second clock regime, having an output coupled to a circuit output terminal;

providing self clearing logic circuitry coupled between the output of said third memory and the clear input to said first memory; and operating said first, second and third memories and said clock signals so that a transition at the input terminal is clocked into said first memory by said first clock signal, subsequently captured into said second memory clocked on said second clock signal, and finally captured into said third memory clocked on said second clock signal, said first memory being cleared when said transition is captured by said third memory so that said first memory is ready to receive subsequent signals from said first clock regime.

17. The method of claim 16, wherein said step of providing said self clearing logic circuitry further comprises the steps of:

providing a nand logic gate coupled to the output of said second memory and to said clock signal from said second clock regime, having an output coupled to the clear input of said first memory; and operating said self clearing logic such that responsive to the clock signal of said second clock regime falling to a logic low level concurrent with said second memory having a high logic level at its output, said nand gate produces a low logic level at its output and clears the first memory.

18. Circuitry for coupling an output transmitted by synchronous logic clocked on a first clock regime to synchronous logic clocked on a second clock regime, comprising:

a first memory coupled to an input terminal and docked on said first clock regime, operable to capture a signal transmitted by said synchronous logic docked on said first clock regime;

a second memory coupled to said first memory and docked on said second clock regime;

a third memory coupled to said second memory and docked on said second dock regime, having an output coupled to a circuit output terminal; and operable to provide a pulse at said circuit output terminal synchronized to said second dock regime in response to a transition at said input terminal.

19. The circuitry of claim 18, wherein said first memory further comprises recirculation circuitry operable to cause the first memory to hold said captured signal.

20. The circuitry of claim 19, and further comprising:

self clearing logic coupled between the output of said third memory and the first memory, operable to cause the first memory to be cleared responsive to the transition at the output of the third memory.

* * * * *